US007947585B2

(12) United States Patent
Baek et al.

(10) Patent No.: US 7,947,585 B2
(45) Date of Patent: May 24, 2011

(54) METHOD OF MANUFACTURING SEMICONDUCTOR DEVICE

(75) Inventors: In Bok Baek, Chungcheongbuk-do (KR); Seong Jae Lee, Daejeon (KR); Jong Heon Yang, Daejeon (KR); Chang Geun Ahn, Daejeon (KR); Han Young Yu, Daejeon (KR); Ki Ju Im, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 21 days.

(21) Appl. No.: 12/090,891

(22) PCT Filed: Dec. 4, 2006

(86) PCT No.: PCT/KR2006/005173
§ 371 (c)(1),
(2), (4) Date: Apr. 21, 2008

(87) PCT Pub. No.: WO2007/066937
PCT Pub. Date: Jun. 14, 2007

(65) Prior Publication Data
US 2008/0254606 A1    Oct. 16, 2008

(30) Foreign Application Priority Data

Dec. 6, 2005   (KR) .................. 10-2005-0118218
Jun. 7, 2006   (KR) .................. 10-2006-0050749

(51) Int. Cl.
*H01L 21/22* (2006.01)
(52) U.S. Cl. ...................................... 438/559
(58) Field of Classification Search .................. None
See application file for complete search history.

(56) References Cited

U.S. PATENT DOCUMENTS 4,350,541 A * 9/1982 Mizushima et al. .......... 438/559
(Continued)

FOREIGN PATENT DOCUMENTS

JP        11-026757       1/1999
(Continued)

OTHER PUBLICATIONS

Shu-Fen Hu, et al; "A Dual-Gate-Controlled Single-Electron Transistor Using Self-Aligned Polysilicon Sidewall Spacer Gates on Silicon-on-Insulator Nanowire", IEEE Transactions on Nanotechnology, vol. 3, No. 1, Mar. 2004, pp. 93-97.

(Continued)

*Primary Examiner* — Charles Garber
*Assistant Examiner* — Andre' C Stevenson
(74) *Attorney, Agent, or Firm* — Ladas & Parry LLP

(57) ABSTRACT

Provided is a method of manufacturing a semiconductor device in which properties of photoresist through a lithography process are changed to form a dummy structure, and the structure is applied to a process of forming a gate electrode. The method includes the steps of: forming a buffer layer on the top of a semiconductor substrate; applying an inorganic photoresist on the buffer layer, and forming a photoresist pattern using a lithography process; thermally treating the photoresist pattern using a predetermined gas; uniformly depositing an insulating layer on the thermally treated structure, and etching the deposited layer by the deposited thickness in order to expose the thermally treated photoresist pattern; depositing an insulating layer on the etched structure, and etching the deposited insulating layer to expose the thermally treated photoresist pattern; removing the exposed photoresist pattern using an etching process; forming a gate oxide layer in the portion in which the photoresist pattern is removed; and forming a gate electrode on the gate oxide layer. Accordingly, in forming a structure for manufacturing a nano-sized device, the properties of the layer formed by a lithography process are improved through thermal treatment, and thus the structure used to manufacture various devices can be easily formed.

20 Claims, 7 Drawing Sheets

U.S. PATENT DOCUMENTS

| | | | |
|---|---|---|---|
| 6,033,963 | A | 3/2000 | Huang et al. |
| 6,225,173 | B1 | 5/2001 | Yu |
| 7,420,201 | B2 * | 9/2008 | Langdo et al. ............. 257/18 |

FOREIGN PATENT DOCUMENTS

| | | |
|---|---|---|
| JP | 11-261063 | 9/1999 |
| JP | 2000-188394 | 7/2000 |

OTHER PUBLICATIONS

A Chatterjee, et al; "Sub-100nm Gate Length Metal Gate NMOS Transistors Fabricated by a Replacement Gate Process", Electron Devices Meeting, 1997, IEDM apos;97. Technical Digest., International Volume, Issue, Dec. 7-10, 1997, pp. 821-824.

International Search Report mailed Mar. 9, 2007, PCT/KR2006/005173.

Namatsu Hideo et al; "Three-dimensional siloxane resist for the formation of nanopatterns with minimum linewidth fluctuations", Journal of Vacuum Science & Technology B: Microelectronicprocessing and Phenomena, American Vacuum Society, New York, NY, US, vol. 16, No. 1, Jan. 1, 1998, pp. 69-76, XP012006654, ISSN: 0734-211X, abstract.

Larrieu Guilhem et al; "Reactive ion etching of a 20 nanometers tungsten gate using a $SF_6/N_2$ chemistry and hydrogen silsesquioxane hard mask resist", Journal of Vacuum Science and Technology: Part B, AVS / AIP, Melville, New York, NY, US, vol. 23, No. 5, Sep. 16, 2005, pp. 2046-2050, XP01280124, ISSN: 1071-1023, abstract.

European Search Report: EP 06 82 3881.

* cited by examiner

[Fig 1]
(a)
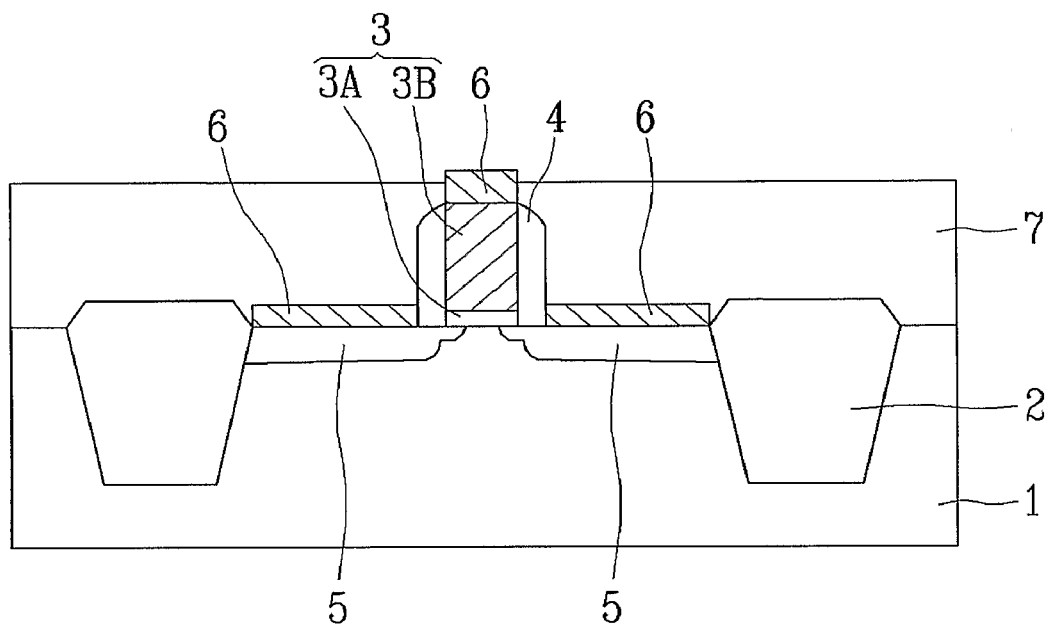
(b)
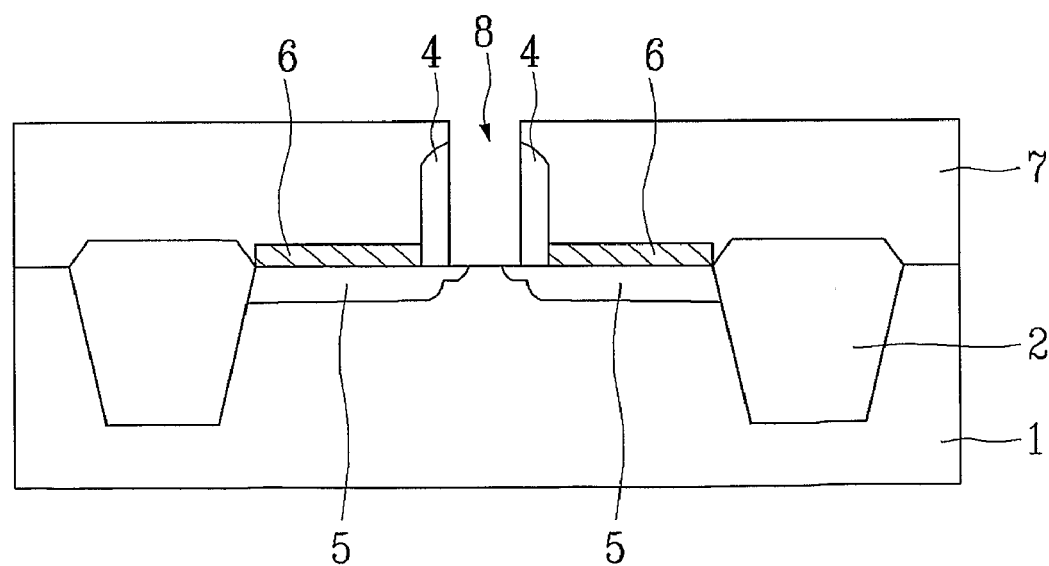

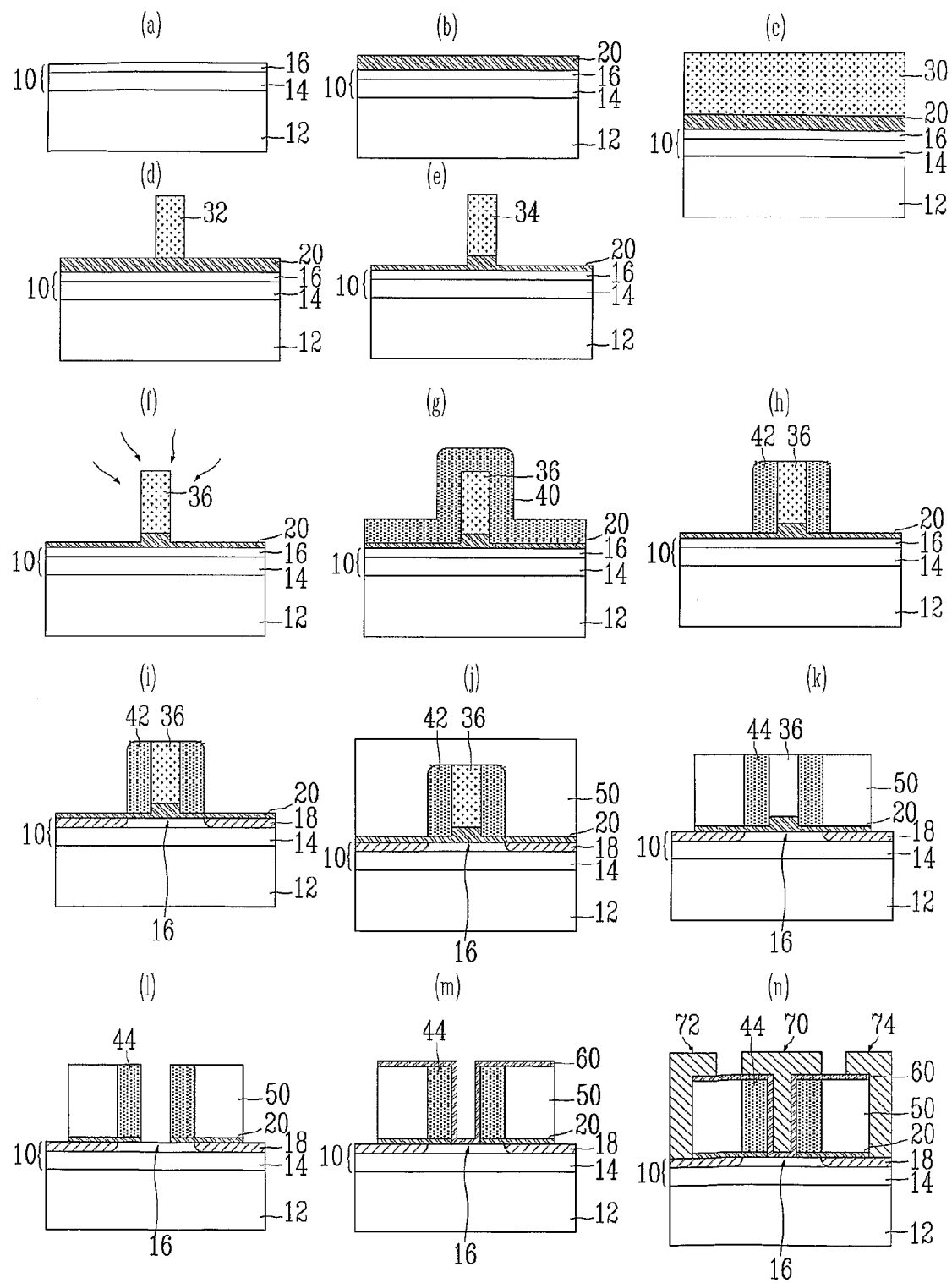
[Fig 2]

[Fig 3]
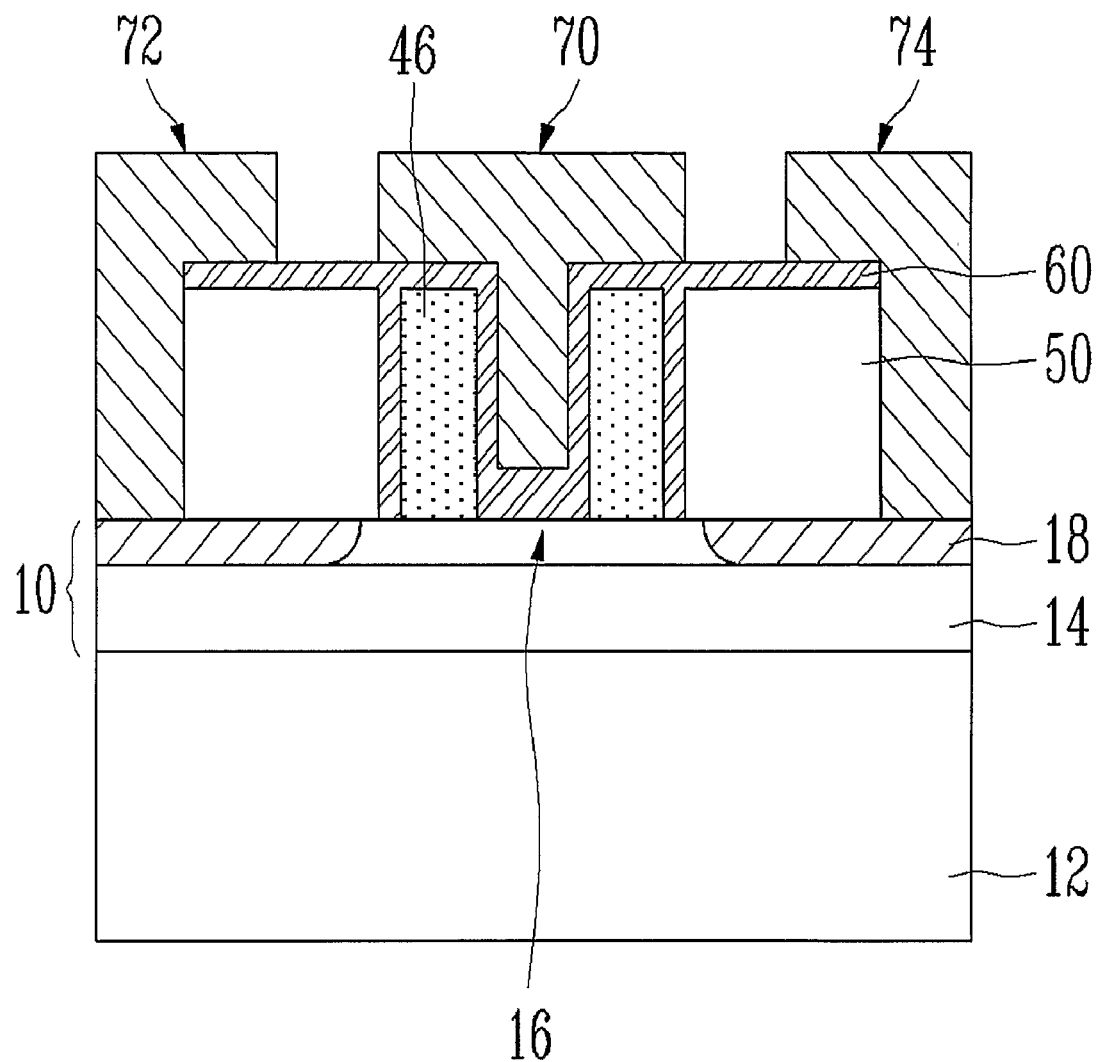

[Fig 4]
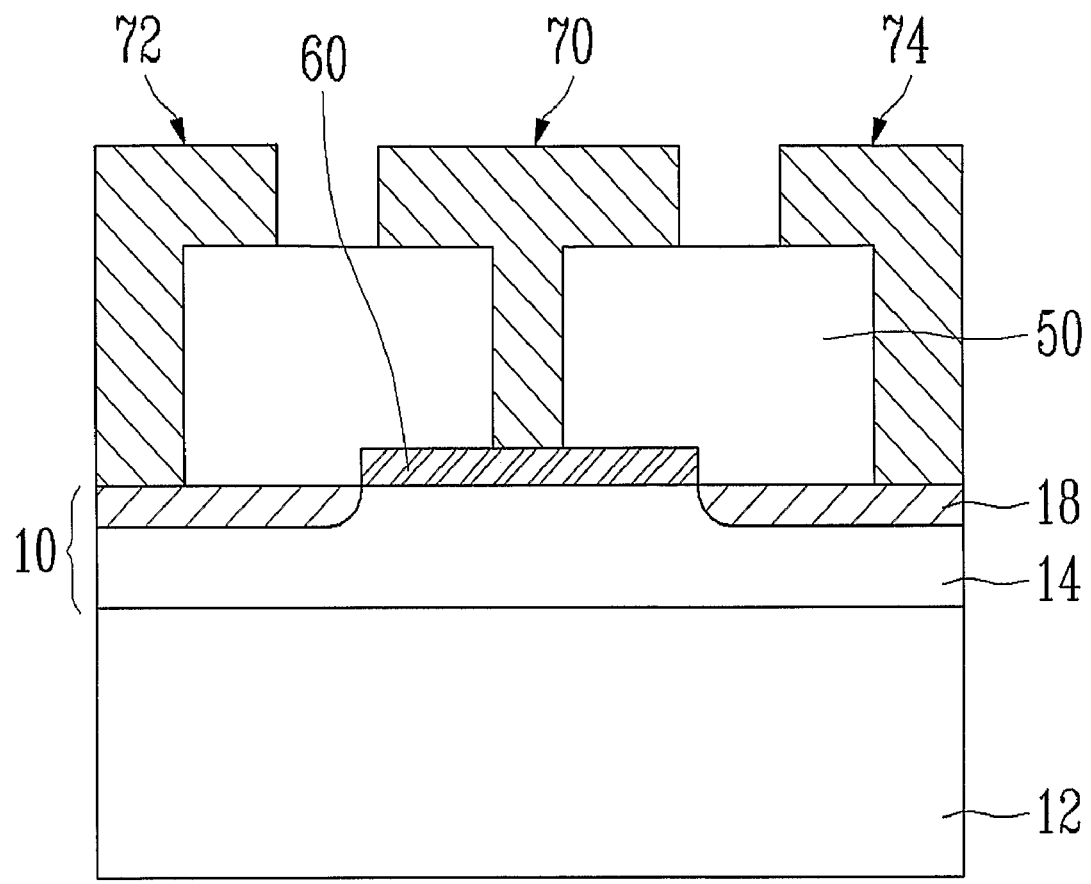

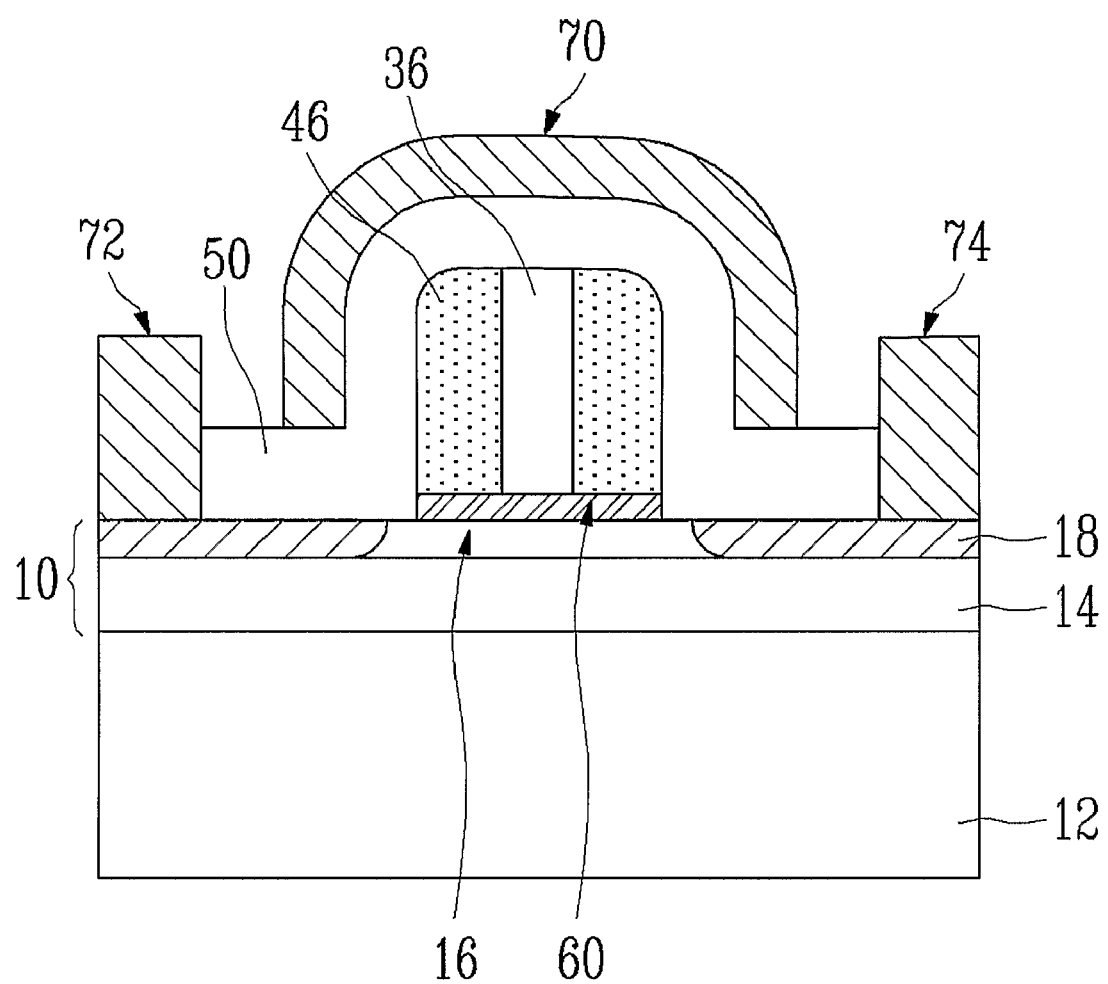
[Fig 5]

[Fig 6]
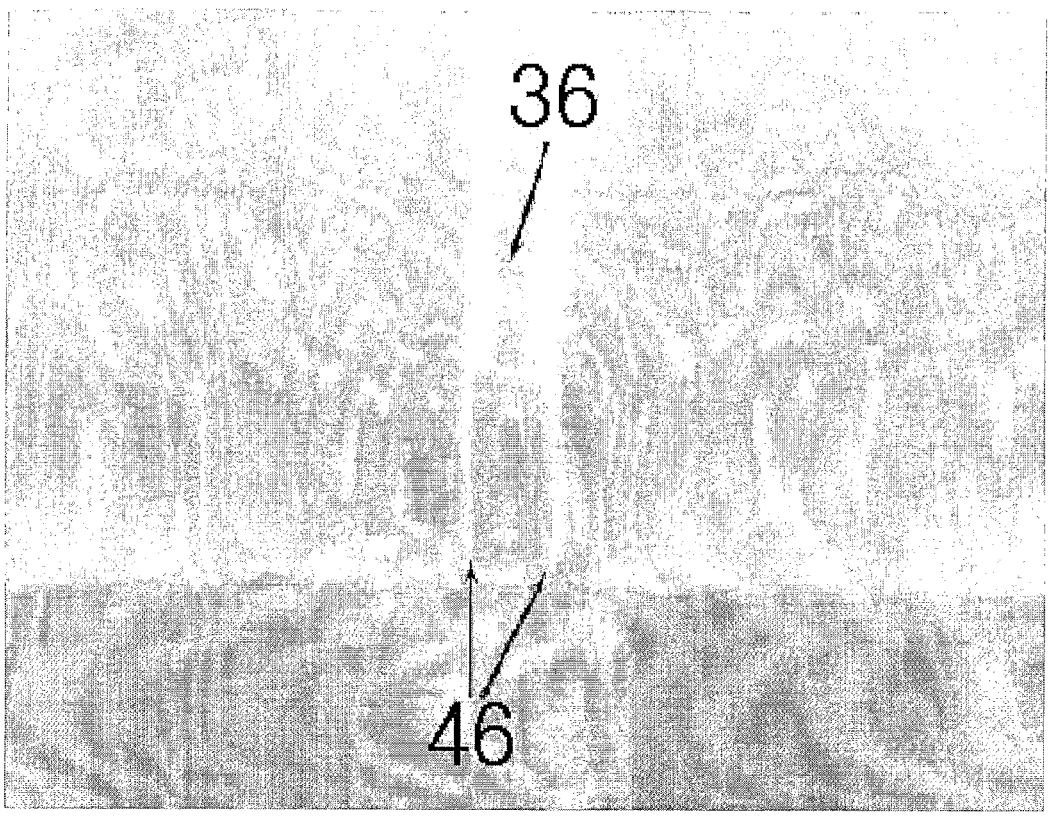

[FIG. 7]
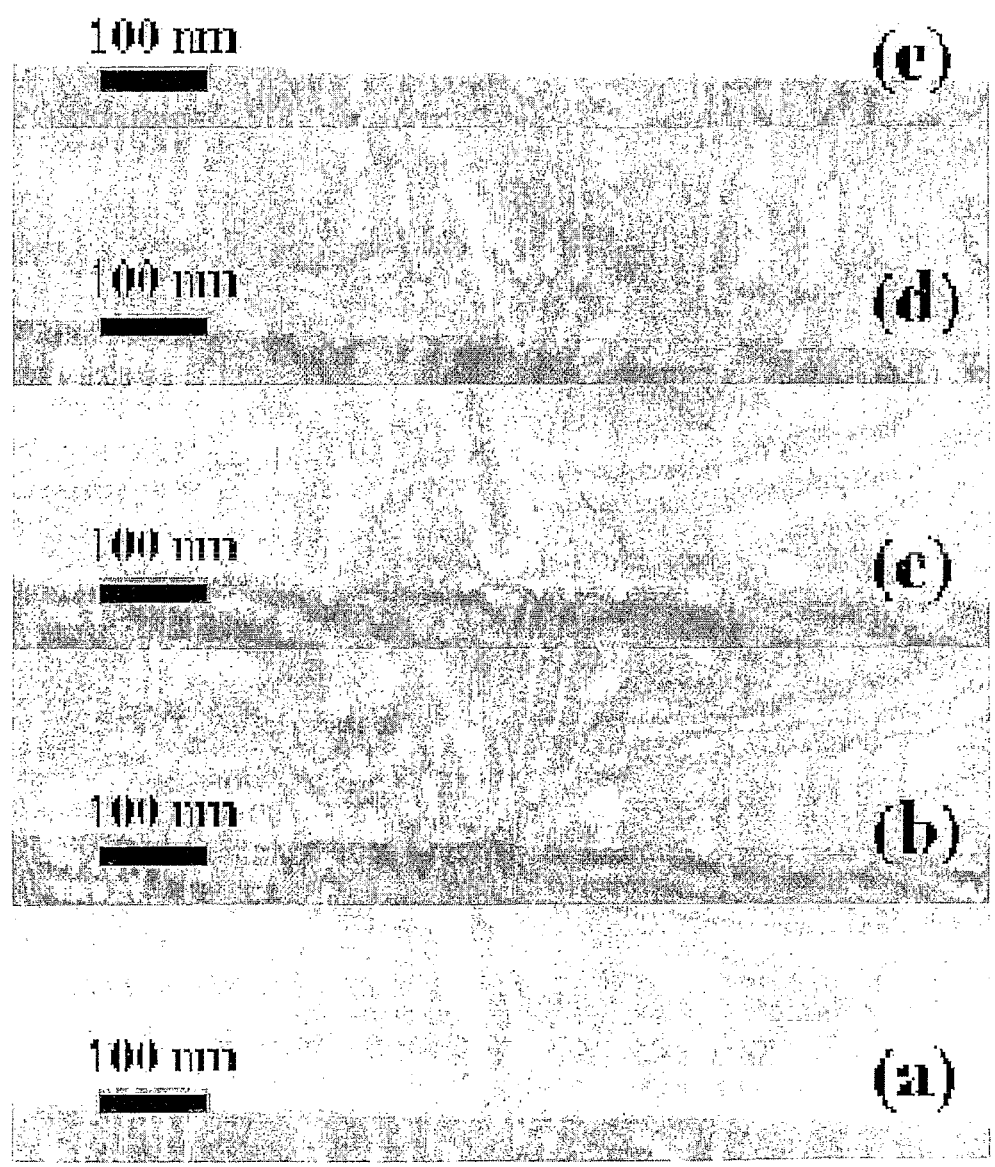

METHOD OF MANUFACTURING SEMICONDUCTOR DEVICE

TECHNICAL FIELD

The present invention relates to a method of manufacturing a semiconductor device, and more particularly, to a method of manufacturing a semiconductor device in which a dummy structure is formed by changing properties of photoresist through a lithography process, and then applied to a process of forming a gate electrode.

BACKGROUND ART

A conventional method of manufacturing a semiconductor device using a dummy structure is disclosed in U.S. Pat. No. 6,033,963.

FIGS. 1A and 1B illustrate processes before and after removing a dummy structure in a method of manufacturing a semiconductor device according to the conventional art.

Referring to FIG. 1A, the structure is formed by preparing a silicon substrate 1 having an isolation layer 2, forming a dummy gate oxide layer 3A on the silicon substrate 1, forming a dummy gate electrode 3B on the dummy gate oxide layer 3A, forming a spacer 4 on a sidewall of the dummy gate, forming source and drain regions 5 by injecting impurities into the surface of the silicon substrate 1, forming a selective tungsten layer 6, and forming an insulating layer 7. Here, the dummy gate oxide layer 3A and the dummy gate electrode 3B function as a dummy structure 3.

Referring to FIG. 1B, a hole 8 is formed after the dummy structure 3 is removed from the structure of FIG. 1A, and then a metal gate electrode is formed in the hole 8.

However, this method of forming the dummy structure has a complicated process which deposits two kinds of materials, and the dummy structure formed by the above method is not clearly removed.

DISCLOSURE OF INVENTION

Technical Problem

The present invention is directed to a method of manufacturing a semiconductor device using a dummy structure, wherein a pattern having an improved property is formed by thermally treating a pattern formed by a lithography process using photoresist with a predetermined gas and the dummy structure is formed using the pattern.

Technical Solution

One aspect of the present invention provides a method of manufacturing a semiconductor device, comprising the steps of: forming a buffer layer on the top of a semiconductor substrate; applying an inorganic photoresist on the buffer layer, and forming a photoresist pattern using a lithography process; thermally treating the photoresist pattern using a predetermined gas; uniformly depositing an insulating layer on the thermally treated structure, and etching the deposited layer by the deposited thickness in order to expose the thermally treated photoresist pattern; depositing an insulating layer on the etched structure, and etching the deposited insulating layer to expose the thermally treated photoresist pattern; removing the exposed photoresist pattern using an etching process; forming a gate oxide layer in the portion in which the photoresist pattern is removed; and forming a gate electrode on the gate oxide layer.

The method may further comprise the step of trimming the photoresist pattern to reduce a line width of the photoresist pattern, and the trimming step may be performed by a dry etching process using $CF_4$ or $CHF_3$ gas, or a wet etching process using hydrofluoric acid (HF).

The predetermined gas may be $O_2$ gas.

The thermal treatment may be performed by a rapid thermal annealing (RTA) process or in a furnace.

Advantageous Effects

According to the present invention as described above, a conventional process of forming a dummy structure can be simplified, and thus a minute pattern can be easily formed compared to a conventional patterning process. Accordingly, by the method of forming a dummy structure using an inorganic photoresist, various types of devices including a nano-sized device can be manufactured and production cost can be reduced due to the simplified process.

BRIEF DESCRIPTION OF THE DRAWINGS

FIGS. 1A and 1B are cross-sectional views illustrating a conventional method of manufacturing a semiconductor device;

FIGS. 2A to 2N are cross-sectional views illustrating a method of manufacturing a semiconductor device according to an exemplary embodiment of the present invention;

FIG. 3 is a cross-sectional view of a device manufactured according to the present invention, in which side gates are formed at both sides of a gate electrode;

FIG. 4 is a cross-sectional view of a device manufactured according to the present invention, in which a typical silicon substrate is used as a semiconductor substrate;

FIG. 5 is a cross-sectional view of a single electron device manufactured according to the present invention;

FIG. 6 is a scanning electron microscope (SEM) photograph showing a basic structure of a device manufactured according to the present invention; and FIG. 7 is a SEM photograph showing a result of a photoresist trimming process using the present invention.

DESCRIPTION OF MAJOR SYMBOL IN THE ABOVE FIGURES

10: semiconductor substrate
12: first single crystal silicon layer
14: buried insulating layer
16: second single crystal silicon layer
18: source and drain regions
20: buffer layer
30: photoresist
32: photoresist subjected to a lithography process
34: photoresist subjected to a trimming process
36: photoresist subjected to a thermal treatment process
40, 42 and 50: insulating layer
44: sidewall spacer
60: gate oxide layer
70: gate electrode
72 and 74: metal line

MODE FOR THE INVENTION

Hereinafter, exemplary embodiments of the present invention will be described in detail. However, the present invention is not limited to the exemplary embodiments disclosed below, but can be implemented in various types. Therefore, the present exemplary embodiments are provided for complete disclosure of the present invention and to fully inform the scope of the present invention to those ordinarily skilled in the art.

FIGS. 2A to 2N are cross-sectional views illustrating a method of manufacturing a semiconductor device according to the present invention.

Referring to FIG. 2A, a silicon-on-insulator (SOI) substrate 10, which is the semiconductor substrate to which the present invention is to be applied, is illustrated.

The SOI substrate 10 comprises a buried insulating layer 14 formed on a first single crystal silicon layer 12, and a second single crystal silicon layer 16 formed on the insulating layer 14. The SOI substrate has a thin insulating layer buried between a surface and a lower layer of the substrate, which may result in reduction of parasitic capacitance and improvement of device's performance. Instead of the SOI substrate 10, a common silicon substrate or a compound substrate such as a GaAs substrate may also be employed as the semiconductor substrate.

Referring to FIG. 2B, a buffer layer 20 is formed on the top of the SOI substrate 10.

The buffer layer 20 is used to prevent damage of the substrate caused by a photoresist trimming process or an ion implantation process, which is a subsequent process, and may be removed depending on the process.

Referring to FIG. 2C, an inorganic photoresist 30 is applied on the top of the buffer layer 20.

The inorganic photoresist 30 may be a negative or positive photoresist. When the negative photoresist is exposed to light, the exposed part is not removed, but the non-exposed part is removed in development. Whereas, when the positive photoresist is exposed to light, the exposed part is removed in development.

An inorganic photoresist material such as hydrogen silsesquioxane (HSQ) is used as the photoresist. This is because an organic photoresist may be damaged in a high temperature process.

Referring to FIG. 2D, a photoresist pattern 32 is formed by performing a lithography process on the photoresist 30.

The lithography process is performed using an apparatus capable of forming a pattern using a light beam, an electron beam, or an ion beam. It has been noted that the minimum line width of a pattern which can be formed by the current lithography process is about 60 nm.

Referring to FIG. 2E, a photoresist pattern 34 is formed by a trimming process to reduce the line width of the photoresist pattern 32.

The trimming process is used to realize a smaller line width than the current lithography process. The trimming process is not a critical element of the present invention, and may be omitted depending on steps.

The trimming process of the photoresist may be generally performed by a wet etching process using diluted hydrofluoric acid (HF). In this case, the buffer layer 20 may be etched without loss depending on the material of the buffer layer 20. In FIG. 2E, a part of the buffer layer 20 is etched by the trimming process.

On the other hand, a dry etching process using CF or CHF gas may be used to prevent collapse of the photoresist pattern 32 during the process of reducing the photoresist pattern 32 to a nanometer size, and thus the line width may be more precisely controlled than in the wet etching.

According to the present invention, the trimming process is applied to the photoresist pattern, and thus its line width may be easily controlled and realized to be smaller than a conventional dummy structure. The result will be described in more detail with reference to FIG. 7.

Referring to FIG. 2F, a photoresist pattern 36 having properties changed by thermally treating the trimmed photoresist pattern 34 using predetermined gas is illustrated.

The thermal treatment may be performed using a rapid thermal annealing (RTA) process or a furnace, and $O_2$ or $N_2$ gas may be used as the predetermined gas. If the RTA process uses another gas instead of $O_2$, a cross-sectional profile of the photoresist pattern is not largely transformed, but the line width of the pattern increases. If the furnace process uses another gas instead of $O_2$, the cross-sectional profile of the photoresist pattern is largely transformed.

As the photoresist pattern 36 is thermally treated, the properties become more hardened, and thus the photoresist pattern 36 may be prevented from transformation or collapse in subsequent processes performed at high temperature.

Referring to FIG. 2G, an insulating layer 40 is deposited to a uniform thickness on the thermally treated structure.

The insulating layer 40 functions as a sidewall spacer by a subsequent process. Instead of the insulating layer 40, a conductive layer may be deposited to form a side electrode. The structure formed by depositing the conductive layer is illustrated in FIG. 3.

Referring to FIG. 2H, the deposited layer is etched by the deposited thickness in order to expose the thermally treated photoresist pattern 36.

The buffer layer 20 may also be exposed by the etch process.

Referring to FIG. 2I, impurity ions are injected through the buffer layer 20 to form source and drain regions in the second single crystal silicon layer 16 of FIG. 2H.

An acceptor ion such as boron (B), gallium (Ga), or indium (In) is injected for p-type doping, or an impurity such as stibium (Sb), arsenic (As), phosphorus (P), or bismuth (Bi) is injected for n-type doping. The source and drain regions 18 are formed by injecting the impurity ions.

Referring to FIG. 2J, an insulating layer 50 is deposited on the structure of FIG. 2I.

The insulating layer 50 may be formed of silicon nitride, spin-on-glass (SOG), or HSQ. In the case that HSQ is used for the inorganic photoresist 30, when the insulating layer 50 is formed of HSQ, it may be etched together with the photoresist pattern 36 which will be removed in a subsequent process. Accordingly, the material of the photoresist has to be considered when the insulating layer is deposited.

Referring to FIG. 2K, the insulting layer 50 of FIG. 2J is etched to expose the thermally treated photoresist pattern 36.

The insulating layer 50 may be etched by a chemical mechanical polishing (CMP) process, and thereby a sidewall spacer 44 is formed.

The sidewall spacer 44 functions as an insulating layer with respect to a sidewall of a gate electrode layer which will be formed in a portion remaining after the thermally treated photoresist pattern 36 is removed in a subsequent process, and functions as an etch stop layer of the gate electrode layer in an etch process for forming a contact hole.

Referring to FIG. 2L, the thermally treated photoresist pattern 36 which is exposed in FIG. 2K is etched to be removed.

The wet or dry etching process may be used as the etching process. Here, the buffer layer 20 which is under the thermally treated photoresist pattern 36 may also be removed.

Referring to FIG. 2M, a gate oxide layer 60 is formed in the portion in which the photoresist pattern 36 is removed.

The gate oxide layer 60 is formed to separate a gate electrode which will be formed in a subsequent process from the semiconductor substrate 10 and the sidewall spacer 44, and also formed on the insulating layer 50. The gate oxide layer 60 may be formed by deposition or growth.

Referring to FIG. 2N, which is a final cross-sectional view of a device formed by a method of manufacturing a semiconductor device according to the present invention, a gate metal layer 70 is formed in the portion in which the gate oxide layer 60 is formed after removing the photoresist pattern 36.

In order to form metal lines on source and drain regions together with the formation of the metal layer 70, a contact hole is formed, and the metal lines are connected to the source and drain regions through the contact hole.

Consequently, in the method of manufacturing a semiconductor device according to the present invention, a dummy structure is formed using only a photoresist pattern, unlike the conventional method of forming the dummy structure. Since the line width of the photoresist pattern is easily controlled by a trimming process compared to the conventional dummy structure, the trimming process should be performed in a process of manufacturing a nano-sized device which requires a minute line width. Meanwhile, since the photoresist pattern may be transformed in a high temperature process, its properties have to be changed by the thermal treatment using a predetermined gas.

FIGS. 3 to 5 are cross-sectional views of devices produced by a method of manufacturing a semiconductor device according to the present invention.

Referring to FIG. 3, side gates 46 are formed at both sides of the gate electrode 70.

Overall, the processes of FIGS. 2A to 2N are used, but the side gate 46 is formed by depositing a conductive layer instead of the insulating layer 40 for forming the sidewall spacer in the step of FIG. 2G.

Referring to FIG. 4, a common silicon substrate 10, instead of the SOI substrate used in the processes of FIGS. 2A to 2N, is used in this process. Also, compared to the processes of FIGS. 2A to 2N, a gate oxide layer 60 is first formed on the silicon substrate 10, source and drain regions 18 are formed, and a photoresist pattern is formed on the gate oxide layer 60 to be used as a dummy structure. After forming the dummy structure, an insulating layer 50 is deposited, and after removing the dummy structure, a gate electrode 70, and metal lines 72 and 74 are formed, which are the same as in FIGS. 2A to 2N.

Referring to FIG. 5, the method of manufacturing a semiconductor device according to the present invention is applied to a manufacturing process of a single electron device. The side gates 46 are formed at both sides of the photoresist pattern 36, and quantum dots are formed on a substrate under the photoresist pattern 36 according to fields formed by the side gates 46, and a topmost gate electrode 70 controls the operation of the single electron device.

FIG. 6 is a scanning electron microscope (SEM) photograph showing a basic structure manufactured by the method of manufacturing a semiconductor device according to the present invention. Referring to FIG. 6, a photoresist pattern 36 having a line width of 20 nm or less is formed using HSQ, which is a high-resolution inorganic electron beam photoresist reacting to light or electron beam. The properties of the layer are improved by RTA using $O_2$ gas, polycrystalline silicon is deposited at a high temperature of 650° C., and side gates 46 are formed to have a line width of 11 nm at both sides of a pattern by dry etching.

This experimental result shows that the gate electrode having a line width of 20 nm or less and the side gate having a line width of 11 nm can be manufactured when the semiconductor device is manufactured by the dummy structure using the photoresist according to the present invention.

FIG. 7 is an SEM photograph showing the result of the trimming process of the photoresist pattern used in the manufacturing process of the semiconductor device according to the present invention. Referring to FIG. 7, it shows that the line width of a pattern is reproductively reduced from 21 nm (initial line width) (a) to 5 nm (e) by dry etching using $CF_4$ gas. Here, the trimming rate is optimized at 4 nm/min, and the respective line widths are (a) 21 nm, (b) 17 nm, (c) 13 nm, (d) 9 nm, and (e) 5 nm.

The experimental result shows that the dummy structure having a minute line width of about 5 nm may be formed by applying a trimming process, and thus it is noted that the method of manufacturing a semiconductor device according to the present invention is a useful technology for manufacturing a nano-sized device. This is because the photoresist pattern is easier to be trimmed than the conventional dummy structure.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A method of manufacturing a semiconductor device, comprising the steps of:
    forming a buffer layer on the top of a semiconductor substrate;
    applying an inorganic photoresist on the buffer layer, and forming a photoresist pattern using a lithography process;
    thermally treating the photoresist pattern using a predetermined gas;
    uniformly depositing a conductive layer on the thermally treated structure, and etching the deposited conductive layer by a deposited thickness in order to expose the thermally treated photoresist pattern wherein the deposited conductive layer is used to form two side gates;
    depositing an insulating layer on the etched structure, and etching the deposited insulating layer to expose the thermally treated photoresist pattern and the two side gates;
    removing the exposed photoresist pattern using an etching process;
    forming a gate oxide layer in the portion in which the photoresist pattern is removed; and
    forming a topmost gate electrode on the gate oxide layer and over the two side gates.

2. The method according to claim 1, wherein the semiconductor substrate is a silicon-on-insulator (SOI) substrate or a compound substrate.

3. The method according to claim 1, wherein the step of forming a pattern using a lithography process uses a light beam, an electron beam, or an ion beam.

4. The method according to claim 1, further comprising the step of: trimming the photoresist pattern to reduce a line width of the photoresist pattern.

5. The method according to claim 4, wherein the trimming step is performed by a dry etching process using $CF_4$ or $CHF_3$ gas, or a wet etching process using hydrofluoric acid (HF).

6. The method according to claim 1, wherein the predetermined gas is $O_2$ gas.

7. The method according to claim 1, wherein the thermal treatment is performed by a rapid thermal annealing (RTA) process or in a furnace.

8. The method according to claim 1, wherein the photoresist pattern is hardened by the thermal treatment.

9. The method according to claim 1, wherein the step of etching the exposed photoresist pattern comprises the step of removing together with the buffer layer under the thermally treated photoresist pattern by etching.

10. The method according to claim 1, further comprising forming quantum dots on the semiconductor substrate.

11. The method according to claim 1, wherein the topmost gate electrode is also formed between the two side gates.

12. The method according to claim 1, wherein the inorganic photoresist comprises a hydrogen silsesquioxane (HSQ) inorganic photoresist.

13. The method according to claim 1, wherein the deposited insulating layer comprises at least one of a silicon nitride deposited insulating layer, a spin-on-glass deposited insulating layer, and a hydrogen silsesquioxane (HSQ) deposited insulating layer.

14. The method according to claim 1, wherein the buffer layer comprises a oxide buffer layer.

15. A method of manufacturing a semiconductor device, comprising the steps of:
  forming a buffer layer on the top of a semiconductor substrate;
  applying an inorganic photoresist on the buffer layer, and forming a photoresist pattern using a lithography process;
  thermally treating the photoresist pattern using a predetermined gas;
  depositing a conductive layer on the thermally treated structure, and etching the deposited conductive layer by a deposited thickness in order to expose the thermally treated photoresist pattern wherein the deposited conductive layer forms two side gates in which the photoresist pattern is sandwiched therein between;
  forming a gate oxide layer on the photoresist pattern and on the two side gates; and
  forming a topmost gate electrode on the gate oxide layer and over the two side gates.

16. The method according to claim 15, wherein the buffer layer is a oxide buffer layer.

17. The method according to claim 15, further comprising forming quantum dots on the semiconductor substrate.

18. The method according to claim 15, wherein the topmost gate electrode is also formed between the two side gates.

19. The method according to claim 15, wherein the inorganic photoresist comprises a hydrogen silsesquioxane (HSQ) inorganic photoresist.

20. The method according to claim 15, wherein the deposited insulating layer comprises at least one of a silicon nitride deposited insulating layer, a spin-on-glass deposited insulating layer, and a hydrogen silsesquioxane (HSQ) deposited insulating layer.

* * * * *